(12) United States Patent
Liu et al.

(10) Patent No.: US 11,612,972 B2
(45) Date of Patent: Mar. 28, 2023

(54) ELECTROSTATIC CHUCK WITH EMBOSSMENTS THAT COMPRISE DIAMOND-LIKE CARBON AND DEPOSITED SILICON-BASED MATERIAL, AND RELATED METHODS

(71) Applicant: ENTEGRIS, INC., Billerica, MA (US)

(72) Inventors: Yan Liu, Lexington, MA (US); Steven Donnell, Burlington, MA (US); Jakub Rybczynski, Arlington, MA (US); Chun Wang Chan, Somerville, MA (US); Caleb Minsky, Medfield, MA (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 17/459,272

(22) Filed: Aug. 27, 2021

(65) Prior Publication Data
US 2022/0063035 A1 Mar. 3, 2022

Related U.S. Application Data

(60) Provisional application No. 63/073,796, filed on Sep. 2, 2020.

(51) Int. Cl.
| | | |
|---|---|---|
| H01T 23/00 | (2006.01) | |
| B23Q 3/15 | (2006.01) | |
| H01L 21/683 | (2006.01) | |
| B23K 1/19 | (2006.01) | |
| H01L 21/687 | (2006.01) | |
| B23K 1/00 | (2006.01) | |
| B23K 103/00 | (2006.01) | |

(52) U.S. Cl.
CPC .............. *B23Q 3/15* (2013.01); *B23K 1/0016* (2013.01); *B23K 1/19* (2013.01); *H01L 21/6833* (2013.01); *H01L 21/68757* (2013.01); *B23K 2103/52* (2018.08)

(58) Field of Classification Search
None
See application file for complete search history.

(56) References Cited

U.S. PATENT DOCUMENTS

| | | | |
|---|---|---|---|
| 8,139,340 B2 | 3/2012 | Reynolds | |
| 8,531,814 B2 | 9/2013 | Stone | |
| 8,861,170 B2* | 10/2014 | Lin | H01L 21/68757 361/234 |
| 9,543,187 B2 | 1/2017 | Cooke | |
| 9,692,325 B2 | 6/2017 | Suuronen | |
| 10,395,963 B2 | 8/2019 | Cooke | |
| 2003/0107865 A1* | 6/2003 | Masuda | H01L 21/6833 361/234 |
| 2013/0120897 A1* | 5/2013 | Lin | H02N 13/00 216/48 |

(Continued)

FOREIGN PATENT DOCUMENTS

| | | |
|---|---|---|
| WO | 2019091694 A1 | 5/2019 |
| WO | 2019120921 A1 | 6/2019 |

*Primary Examiner* — Stephen W Jackson

(57) ABSTRACT

Described are electrostatic chucks that are useful to support a workpiece during a step of processing the workpiece, the electrostatic chuck including embossments that are made of multiple deposited layers, the layers including diamond-like carbon layers and layers that contain silicon-based materials such as silicon carbide layers.

20 Claims, 1 Drawing Sheet

(56) References Cited

U.S. PATENT DOCUMENTS

2013/0155569 A1* 6/2013 Suuronen ............ H01L 21/6833
　　　　　　　　　　　　　　　　　　　　361/234
2015/0311108 A1　10/2015　Horiuchi
2018/0130692 A1　5/2018　Ishino

* cited by examiner

ELECTROSTATIC CHUCK WITH EMBOSSMENTS THAT COMPRISE DIAMOND-LIKE CARBON AND DEPOSITED SILICON-BASED MATERIAL, AND RELATED METHODS

CROSS-REFERENCE TO RELATED APPLICATIONS

This application claims the benefit under 35 USC 119 of U.S. Provisional Patent Application No. 63/073,796, filed Sep. 2, 2020, the disclosure of which is hereby incorporated herein by reference in its entirety.

FIELD OF THE INVENTION

The invention is in the field of electrostatic chucks that are useful to support a workpiece during a step of processing the workpiece, the electrostatic chuck including embossments that are made of multiple deposited layers, the layers including diamond-like carbon layers and layers that contain silicon-based materials such as silicon carbide layers.

BACKGROUND

Electrostatic chucks (also referred to simply as "chucks," for short) are used in semiconductor and microelectronic device processing. A chuck holds in place a workpiece such as a semiconductor wafer or microelectronic device substrate to perform a process on a surface of the workpiece. In particular, the electrostatic chuck secures the workpiece to an upper surface of the chuck by creating an electrostatic attractive force between the workpiece and the chuck. A voltage is applied to electrodes that are contained within the chuck to induce charges of opposite polarities in the workpiece and the chuck.

The chuck includes various structures, devices, and designs that allow the chuck to perform or that improve performance. Often, an electrostatic chuck may be a multi-layer structure that includes: a flat upper surface that supports a workpiece; electronic components such as electrodes, a conductive coating, and ground connections to control electrostatic charges of the chuck and a supported workpiece; and various other functionalities that may include measurement probes and moveable pins used to support or to change a position of a workpiece relative to the chuck.

A typical feature of an electrostatic chuck is a pattern of small embossments (sometimes referred to as "protuberances") that extend a very small distance above an upper surface of the chuck to support a workpiece at a small distance above a main chuck surface, and to create a very small space between the lower surface of the workpiece and the upper surface of the chuck. With the embossments, only a small portion of the upper surface of the chuck contacts the lower surface of the workpiece. The reduced area of contact between the two surfaces can reduce debris that may be generated by contacting surfaces. Additionally, in some chuck designs, the space created by the embossments between the workpiece and the chuck is used for cooling the workpiece by flowing a cooling gas into the space.

SUMMARY

Current embossments designs on electrostatic chuck assemblies are subject to wear and degradation that occur with a large number of use cycles that include placing and removing a workpiece onto and from the embossments. The embossments become worn down from an original size (including an original height), partially or completely, over extended periods of use. After excessive wearing down of the embossments, wafers that are placed onto the surface will contact the upper dielectric surface of the electrostatic chuck, which can produce particle debris, thermal transfer between the chuck and a supported workpiece, and other performance complications that will reduce the overall performance and effectiveness of the electrostatic chuck. Ongoing need exists for new and better-performing, more durable embossments.

Multi-layer deposited coatings that include multiple layers of silicon carbide and diamond-like carbon have been used for coating certain specific types of surfaces for industrial applications. Examples include wear-resistant surfaces used in biomedical applications (implants), in aerospace applications, for applications in the field of oil exploration, and for applications related to plastic injection molding. Previously, multi-layer deposited coatings that include multiple layers of silicon carbide and diamond-like carbon have not been deposited with pattern-coating techniques such as photolithography, and have not been applied as a pattern of embossments to a ceramic, optionally conductive, wafer-contacting upper surface of an electrostatic chuck. The previous coatings have been applied to surfaces as continuous coatings over an entire operative (bearing) surface of a device, but not in a pattern over only portions of a larger operative surface.

In one aspect, the invention relates to an electrostatic chuck assembly that includes a wafer support surface that includes a ceramic layer with at least one embossment at an upper surface of the ceramic layer. The embossment includes multiple layers that include at least two layers of deposited silicon-based material, and at least two diamond-like carbon layers.

In another aspect, the invention relates to a method of preparing an electrostatic chuck assembly that includes a ceramic layer with at least one embossment at an upper surface of the ceramic layer. The embossment includes multiple layers that include at least two layers of deposited silicon-based material and at least two diamond-like carbon layers. The method includes depositing the embossments onto the upper surface by a deposition method.

Figure 1:
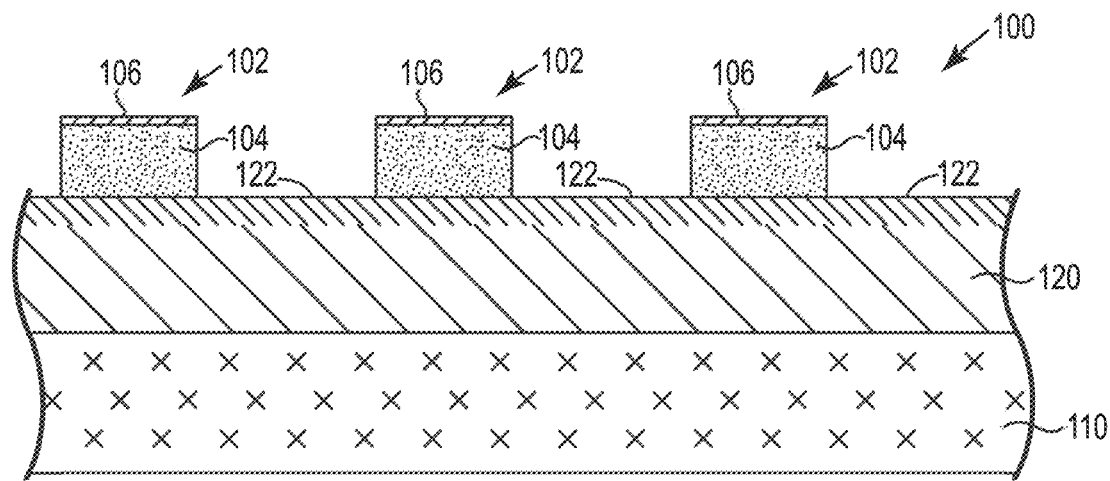
FIG. 1 is a side cut-away schematic view of a portion of an example prior art electrostatic chuck assembly.

All figures are schematic and are not necessarily to scale.

DETAILED DESCRIPTION

An electrostatic chuck as described is a multi-layer structure that includes multiple different layers assembled together to form an electrostatic chuck assembly, as well as precursors or portions thereof as described. The assembly includes various features that are typical of an electrostatic chuck assembly and that allow the chuck to support a workpiece (e.g., semiconductor substrate, a microelectronic device, a semiconductor wafer, a precursor thereof), during processing, with an electrostatic attractive force holding the workpiece in place at an upper surface (the workpiece-contacting surface) of the chuck. Example workpieces used with an electrostatic chuck include semiconductor wafers, flat screen displays, solar cells, reticles, photomasks, and the like. The workpiece may have an area equal to or greater than that of a circular 100 millimeter diameter wafer, a 200 millimeter diameter wafer, a 300 millimeter diameter wafer or a 450 millimeter diameter wafer.

The chuck includes an upper surface (a "workpiece-contacting surface") that is adapted to support a workpiece during processing. The upper surface typically has a circular surface area with a circular edge that defines a circular perimeter, and that also defines a diameter of both the workpiece-contacting surface and the multi-layer chuck. As used herein, the term "workpiece-contacting surface" refers to the upper exposed surface of an electrostatic chuck that contacts a workpiece during use, and that includes a "main field" made of a ceramic material and having an upper surface, with embossments at the upper surface, and with an optional conductive coating that may cover a least a portion of the upper surface. The workpiece is held at the workpiece-contacting surface, in contact with upper surfaces of the embossments, above the upper surface of the ceramic material, and is held against or "clamped" to the electrostatic chuck during use of the electrostatic chuck. Example electrostatic chuck assemblies may be used with AC and DC Coulombic chucks and Johnsen-Rahbek chucks.

The chuck assembly (or "chuck" for short) also includes a number of other layers, devices, structures, or features that are required or optional for the chuck to function. These include: an electrode layer that generates an electrostatic attraction between the chuck and the workpiece to hold the workpiece in place during processing; a grounding device such as a grounding layer and related electrical connections; measurement devices for measuring pressure, temperature, or an electrical property during a processing step; gas flow conduits as part of a temperature control function; a conductive surface coating; as well as others.

One layer of the multi-layer structure is a ceramic layer (a.k.a., a dielectric layer) at an upper portion of the assembly. The ceramic layer may be a top layer of the assembly and may include the upper surface of the chuck, other than a conductive coating, protuberances, or the like, placed on the upper surface of the ceramic layer. An electrically conductive coating at the upper surface may be connected to electrical ground through a grounding layer, a grounding pin, or the like, also included in the multi-layer assembly. The ceramic layer may be made of a useful ceramic material such as alumina, aluminum nitride, quartz, $SiO_2$ (glass), among others. The ceramic layer may be made of a single (integral) layer of material, or may alternately be made of two or more different materials, e.g., multiple layers of different materials, if desired. A total thickness of a ceramic layer (having one or multiple layers of ceramic materials) may be any effective thickness, for example a thickness in a range from 1 to 10 millimeters, e.g., from 1 to 5 millimeters.

The ceramic layer is supported below by a base layer ("base" for short), which is typically made of metal, such as aluminum, aluminum alloy, titanium, stainless steel, ceramic such as alumina, a metal matrix composite, among others.

Typically between the ceramic layer and the base is one or more of: a bonding layer (e.g., a polymeric adhesive), an electrode, a grounding layer, an insulating layer that allows the electrodes and other layers to function electrically, or additional circuitry.

A chuck assembly of the present description includes a pattern of multiple three-dimensional embossments distributed across the area of the upper surface of the ceramic layer. One or more of the embossment is a multi-layer structure made to include multiple (at least two) deposited layers of diamond-like carbon and multiple (at least two) deposited layers of a deposited silicon-based material, one example of such a material being silicon carbide. Other layers or materials that are not either deposited silicon-based material or diamond-like carbon may be included in the multi-layer embossment, if desired, but example embossments do not require any other materials or layers. Also, a chuck assembly that includes one or more embossments as described, made from multiple layers of deposited silicon-based material and diamond-like carbon, may optionally include one or more embossments that are not made from multiple-layers of deposited silicon-based material and diamond-like carbon, e.g., one or more embossments that are made from one or more other types of ceramic, dielectric, or conductive materials.

The total amount of layers or material of an embossment may comprise, consist essentially of, or consist of only deposited silicon-based material and diamond-like carbon. For example an embossment may consist of alternating layers of deposited silicon-based materials, and diamond-like carbon, i.e., may contain only layers of these two materials. A multi-layer embossment that consists essentially of these two types of layers is a multi-layer structure that contains at least 95, 98, or 99 percent of all layers of the structure that are made of deposited silicon-based materials carbide layers and diamond-like carbon layers, based on a total number of layers. Alternately, a multi-layer embossment that consists essentially of deposited silicon-based material and diamond-like carbon refers to a multi-layer embossment that contains at least 95, 98, or 99 weight percent deposited silicon-based material and diamond-like carbon, based on total weight of all materials of an embossment.

Diamond-like carbon (also referred to as "DLC") is a known material, sometimes referred to as "CVD diamond" (i.e., diamond deposited by chemical vapor deposition). Diamond-like carbon is a type or class of amorphous carbon materials that have properties similar to diamond, and that contain a mixture of both sp2 and sp3 carbon-carbon interatomic bonds. Diamond-like carbon can be deposited onto a substrate using any of various deposition methods, including chemical vapor deposition (CVD), plasma-enhanced chemical vapor deposition (PECVD), and physical vapor deposition (PVD), among others.

Diamond-like carbon that is useful as a layer of an embossment as described can be of a relatively high purity, such as by being formed of at least 90, 95, 98, or 99 percent (atomic) carbon atoms. Optionally, as desired, physical or electrical properties of diamond-like carbon can be adjusted by including an atomic dopant, impurity, or other additive within the diamond-like carbon structure when preparing the material by deposition. For example, one or more diamond-like carbon layers of one or more embossments of a chuck assembly as described may be deposited to include a dopant material that increases the electrical conductivity of the diamond-like carbon layer, allowing the diamond-like carbon layer to conduct and pass an electrical charge between an electrostatic chuck as described and a wafer supported by the embossment.

Deposited silicon-based materials are well known solid materials that contain a high amount of silicon atoms in combination with one or a combination of carbon atoms, oxygen atoms, and nitrogen atoms. A useful or preferred deposited silicon-based material may be made substantially of or entirely of silicon atoms combined with one or a combination of carbon, oxygen, and nitrogen atoms, e.g., will contain at least 90, 95, 98, 99, or 99.5 percent (atomic) silicon, carbon, oxygen, and nitrogen atoms.

Examples of known deposited silicon-based materials include silicon nitride (SiN), silicon carbide (SiC), silicon oxide (e.g., silicon dioxide, $SiO_2$), and silicon oxynitride (SiON). These materials may be deposited as thin layers (e.g., at a thickness of below 100 microns) onto a substrate using any of various deposition methods, including chemical vapor deposition (CVD), plasma-enhanced chemical vapor deposition (PECVD), physical vapor deposition (PVD), among others. A silicon-based material may be pattern coated using any of various known pattern-coating techniques such as photolithography.

According to particular examples of embossments as described, the deposited silicon-based material can be silicon carbide (SiC). Silicon carbide may be deposited onto a substrate by known methods, such as by chemical vapor deposition (CVD), plasma-enhanced chemical vapor deposition (PECVD), physical vapor deposition (PVD), among others. Silicon carbide can be pattern coated using any of various known pattern-coating techniques such as photolithography.

The deposited silicon-based material, using a method as described, can be deposited onto a substrate at a high level of purity, e.g., such as by being formed of at least 95, 98, or 99 percent (atomic) of the silicon-based material, e.g.: silicon nitride (SiN), silicon carbide (SiC), silicon oxide (e.g., silicon dioxide, $SiO_2$), or silicon oxynitride (SiON). A useful or preferred embossment may contain multiple silicon carbide layers, each layer having a relatively high purity, such as by being formed of at least 95, 98, or 99 percent (atomic) silicon and carbon atoms.

The embossments as described can be prepared by any method that forms a desired pattern of embossments over the ceramic surface. Useful and preferred methods include methods that deposit a pattern of the embossments spaced from each other over an area of a ceramic surface of a multi-layer electrostatic chuck assembly, or a precursor (ceramic layer) thereof, by a pattern coating method such as photolithography, using plasma-enhanced chemical vapor deposition. By these methods, alternately-deposited layers of deposited silicon-based material (e.g., silicon carbide) and diamond-like carbon are deposited using a mask that contains multiple openings for forming individual embossments, e.g., a photolithographic mask with openings to form at least one embossment, preferably a pattern of multiple embossments distributed over an upper surface of a ceramic layer. Each deposited embossment includes layers of deposited silicon-based material (e.g., silicon carbide) and diamond-like carbon of thicknesses that are preferably in a range that results in stability of the multi-layer structure. Example thicknesses of the individual silicon carbide and diamond-like carbon layers of an embossment can be from below one micron to a few microns, e.g., from 0.5 to 5 microns, such as from 1 or 2 microns for a diamond-like carbon layer, and below 50 microns for a layer of deposited silicon-based material.

The thicknesses of silicon-based material layers and diamond-like carbon layers of the embossments can affect physical stability of the embossments. Because the layers are made of two different materials, and because each layer has very small dimensions (length, width, and height), thermodynamic stresses exist at the interfaces of the different materials of adjacent layers. The stresses may cause potential delamination or separation of layer of a multi-layer embossment, resulting in degradation or non-functionality of the embossment. Thicknesses of more than about 5 microns for a diamond-like carbon layer may sometimes produce an amount of stress that may cause a multi-layer embossment to be relatively less stable than layers with lower thicknesses. Thus, preferred diamond-like carbon layers can have thicknesses that result in desired stability of the multi-layer embossment, which may include thicknesses of below about 5 or below about 3 microns.

An example of a previous (prior art) type of a multi-layer chuck assembly design is shown schematically and in a side cross-section view at FIG. 1. Assembly 100 includes horizontally extending base 110 and horizontally extending ceramic layer 120, having an upper exposed surface that defines main field 122. Other optional layers or structures such as an adhesive ("bonding") layer, an electrode layer, a ground layer, a conductive coating at an upper surface, among others, can also be included but are not illustrated. Embossments 102 include a bottom silicon carbide layer 104 and an upper layer 106 of diamond-like carbon, which is thinner than the lower silicon carbide layer. During use, a substrate (not shown) rests on upper surfaces of embossments 102, in contact with diamond-like carbon layers 106. The upper diamond like coating layer is about 1 micron thick and the lower silicon carbide layer has a thickness from about 6 to about 8 microns.

The example embossments of multi-layer chuck assembly 100 of FIG. 1, made of a single layer of diamond-like carbon atop a relatively thicker base of silicon carbide, are effective for use over many cycles of clamping and removing a substrate. However, embossments 102 are subject to wear and deterioration during use over a very large number of such cycles. An example of a multi-layer chuck assembly design of the present description is shown schematically and in a side cross-section view at FIG. 2. Assembly 200 includes horizontally-extending base 210 and horizontally-extending ceramic layer 220, having an upper exposed surface that defines main field 222. Other optional layers or structures such as an adhesive ("bonding") layer, an electrode layer, a ground layer, a conductive coating at an upper surface, among others, can also be included but are not illustrated.

Embossments 202 include multiple (at least two or three) silicon carbide layers 204 and multiple (at least two or three) layers 206 of diamond-like carbon. As illustrated, this includes an upper (top) layer of diamond-like carbon. During use, a substrate (not shown) rests on upper surfaces of embossments 202 in contact with the top surfaces of diamond-like carbon layers 206. A multi-layer chuck assembly having embossments as described and as shown at FIG. 2, comprising multiple layers of silicon carbide and multiple layers of diamond-like carbon, exhibits improved durability and wear resistance relative to a chuck assembly of FIG. 1, made of a single layer of diamond-like carbon atop a base of silicon carbide.

For example, embossments 202 may be capable of enduring substantially more cycles of clamping and removing a substrate, referred to as "use cycles," when compared to comparable embossments that are of non-inventive designs. The amount of improvement in useful lifetime of embossments of a chuck as described, measured in use cycles, can depend on various factors, with significant factors being the number of layers of diamond-like carbon of embossments of a chuck, as well the total amount (total thickness) of diamond-like carbon that is present in embossments of the chuck. When comparing performance of an inventive chuck (e.g., a chuck of FIG. 2, having the inventive embossments) to a chuck of FIG. 1 (having two-layer embossments, one layer of silicon carbide and one layer of diamond-like carbon), an inventive chuck will be useful for a substantially increased number of use cycles, e.g., at least twice or three times the number of use cycles. For an inventive chuck that includes embossments having six total layers, including three layers of silicon carbide and three layers of diamond-like carbon, the increase in the number of use cycles will be at least two or three times the number of use cycles that can be performed using the FIG. 1 chuck.

When comparing performance of an inventive chuck (e.g., a chuck of FIG. 2, having the inventive embossments) to a chuck having comparable embossments (comparable in terms of size, shape, and number and placement of the embossments on a surface of a chuck), but that are made entirely of silicon carbide (without any diamond-like carbon), an inventive chuck will exhibit an even greater increase in the number of use cycles, e.g., least 5, 10, or 100 times the number of use cycles. Embossments 202 of FIG. 2 or as otherwise described herein may have any useful number of total layers, any useful number of layers made of deposited silicon-based material (e.g., silicon carbide layers), and any useful number of diamond-like carbon layers.

Figure 2:
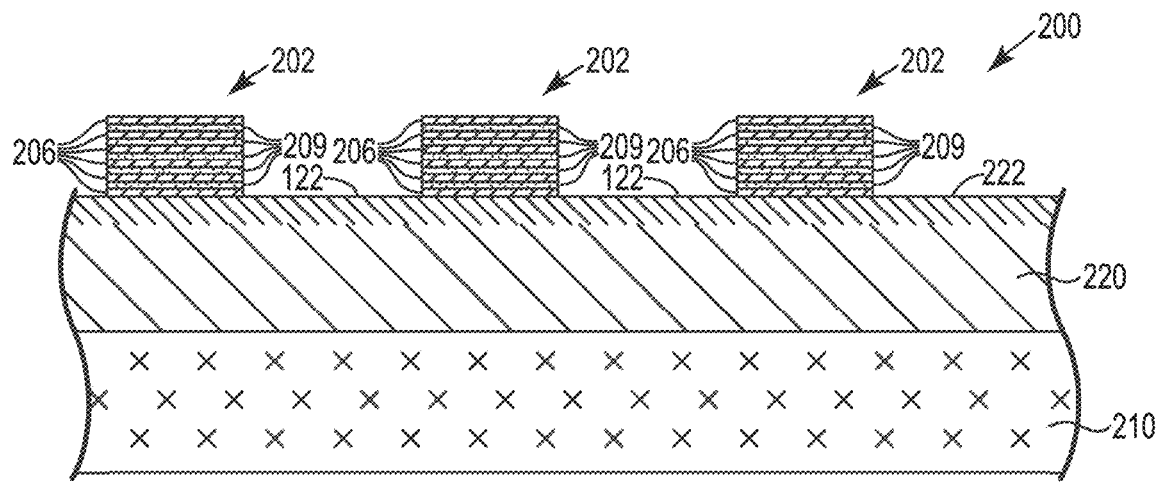
FIG. 2 is a side cut-away schematic view of a portion of an electrostatic chuck assembly of the present description.

Optionally, but not illustrated at FIG. 2, one or more layers of a different material may be present as a layer of the embossment, but other layers are not required. Example embossments may contain from 4 up to 20, 25, 50, or 100 layers (total), with at least two of the layers being silicon carbide layers (or layers of another type of deposited silicon-based material) and at least two of the layers being diamond-like carbon layers. Example embossments contain (e.g., consist of) multiple pairs (e.g., 2, 3, 5, 10, 25, or 50 pairs) of alternating layers of deposited silicon-based material (e.g., silicon carbide) and diamond-like carbon, with no other layers or materials being present between these alternating layers.

Example embossments may consist of alternating layers of deposited silicon-based material (e.g., silicon carbide) and diamond-like carbon. Each layer of deposited silicon-based material may preferably have a thickness in a range from about 1 micron thick to about 50 microns, such as a thickness in a range from 1 to 20, 30, 40, or 50 microns. The diamond-like carbon layers may have thicknesses in a range from 1 to 5 microns, or otherwise, as will exhibit useful stability of the layer and the multi-layer embossment.

As one particular example, an embossment (i.e., multiple embossments of a chuck) may include a bottom layer that is silicon carbide having a thickness of about 2 microns and a top layer that is diamond-like carbon having a thickness of about 2 microns. Between the bottom silicon carbide layer and the top diamond-like carbon layer can be multiple layers of silicon carbide, each of which may be of a thickness up to about 50 microns, e.g., from about 1 or 2, up to about 20, 30, 40, or 50 microns thick. Also between the top and bottom layer may be multiple layers of diamond-like carbon, each of which may be of a thickness in a range from 1 to 5 microns, e.g., of a thickness in a range from 1 to 2 micron thickness. The multi-layer embossments may consists of from 2, 3, 5, 6, 10, 25, or 50 alternating pairs of layers of silicon carbide and diamond-like carbon.

The ratio of a thickness of an individual silicon carbide layer of an embossment, to a thickness of a diamond-like carbon layer of the embossment, may be in a range from 1:1 to 10:1. The ratio of the total amount (by weight) of silicon carbide material to diamond-like carbon material in an embossment may be in the same range, from 1:1 to 10:1. In different examples of useful multi-layer embossments, all silicon carbide layers may have the same thickness, or different silicon carbide layers may have different thicknesses. Similarly, all diamond-like carbon layers of an embossment may have the same thickness, or different layers of diamond-like carbon may have different thicknesses.

Embossments of an electrostatic chuck can be sized relative to a total surface area of an electrostatic chuck, and distributed over the upper surface of an upper ceramic layer, in any manner that will be effective to support a wafer during use. An example of a useful amount of area of embossments (total area of embossments of a chuck) relative to the total surface area of the electrostatic chuck may be an area of the embossments (at top surfaces of the embossments) that is equal to from about 1 percent to about 10 percent of a total surface area of the upper surface of the electrostatic chuck. Each protrusion may have a useful diameter, with example diameters being in a range from about 0.5 millimeters to about 1.5 millimeters, e.g., from about 0.75 millimeters to about 1 millimeter. The shape of each embossment is three-dimensional, and may be any useful shape, such as a cylindrical shape with a circular upper surface.

A height of a protrusion may be any useful height, such as a height in a range from 5 or 10 microns up to 20, 30, 50, or 100 microns. Generally, many, most, or all protrusions at a surface of a particular electrostatic chuck will have the same height, and will have the same number and thicknesses of layers of deposited silicon-based material (e.g., silicon carbide layers) and diamond-like carbon layers.

A chuck assembly as described may be used in equipment and processes useful for processing a workpiece using any of various known processing steps that involve the use of an electrostatic chuck. The described chuck and related methods may be particularly useful for semiconductor wafer processing, but may also be used for other processes. Examples of equipment and systems with which an electrostatic chuck may be used include: beam line ion implanters, plasma doping ion implanters, plasma immersion ion implantation systems, flood ion implanters, focused plasma systems, systems that modulate a plasma sheath, etching systems, optical based processing systems, chemical vapor deposition systems, coating systems, etching systems, lithography systems, and other devices and tools useful for processing semiconductor and microelectronic devices.

Processes or uses of an electrostatic chuck as described can involve using the chuck for chucking (attraction) and dechucking (release) of a substrate or workpiece. Processes or uses can include those that result in the addition or generation of heat to the workpiece In some processes a workpiece is held in a reduced pressure environment in a vacuum chamber while engaged by the chuck, for example during reactive ion-etching (RIE), plasma etching, ion-beam etching, etching, physical vapor deposition (PVD), chemical vapor deposition (CVD), or other processes. During use, or during a process, an electrostatic chuck may, for example, retain a substrate in a chucking step; undergo a coating, implant or other treatment; and then release the substrate in dechucking step. These steps or acts may be repeated.

In a first aspect, an electrostatic chuck assembly comprises a wafer support surface that comprises a ceramic layer with at least one embossment at an upper surface of the ceramic layer, the embossment comprising multiple layers that include at least two layers of deposited silicon-based material, and at least two diamond-like carbon layers.

A second aspect according to first aspect, wherein the embossments comprise at least 6 total layers that include at least 3 layers of deposited silicon-based material and at least 3 diamond-like carbon layers, each silicon carbide layer and each diamond-like carbon layer having a thickness in a range from 0.5 to about 3 microns.

A third aspect according to any of the preceding aspects, wherein a top layer of the embossment is a diamond-like carbon layer.

A fourth aspect according to any of the preceding aspects, wherein the deposited silicon-based material is selected from silicon nitride (SiN), silicon carbide (SiC), silicon oxide (e.g., silicon dioxide, $SiO_2$), and silicon oxynitride (SiON).

A fifth aspect according to any of the preceding aspects, wherein the embossment consists of alternating layers of the deposited silicon-based material and diamond-like carbon.

A sixth aspect according to any of the preceding aspects, wherein the deposited silicon-based material is silicon carbide.

A seventh aspect according to any of the preceding aspects, wherein the embossments include multiple layers of silicon carbide and diamond-like carbon, each silicon carbide layer and each diamond-like carbon layer having a thickness in a range from 1 to 5 microns.

An eighth aspect according to any of the first through fifth aspects, further comprising multiple embossments that each comprise multiple layers that include at least two silicon carbide layers and at least two diamond-like carbon layers.

A ninth aspect according to any of the preceding aspects, wherein the embossment includes from 4 to 100 total silicon carbide layers and diamond-like carbon layers.

A tenth aspect according to any of the preceding aspects, wherein the embossment has a diameter in a range from 0.75 to 1.5 millimeters.

An eleventh aspect according to any of the preceding aspects, wherein the embossment has a height in a range from 5 to 100 microns.

A twelfth aspect according to any of the preceding aspects, wherein the diamond-like carbon contains atomic dopant to increase electrical conductivity of the embossment.

A thirteenth aspect according to any of the preceding aspects, wherein the embossments cover an area that is equal to from 1 to 10 percent of a total area of the upper surface.

A fourteenth aspect according to the first aspect, further comprising multiple embossments, each embossment consisting of a total of from 4 to 100 total silicon carbide layers and diamond-like carbon layers, wherein the embossments cover an area that is equal to from 1 to 10 percent of a total area of the upper surface.

In a fifteenth aspect, a method of preparing an electrostatic chuck assembly that comprises a ceramic layer with at least one embossment at an upper surface of the ceramic layer, the embossment comprises multiple layers that include at least two layers of deposited silicon-based material and at least two diamond-like carbon layers, the method comprising depositing the embossments onto the upper surface by a deposition method.

A sixteenth aspect according to the fifteenth aspect, wherein the deposition method is plasma-enhanced chemical vapor deposition.

A seventeenth aspect according to the fifteenth or sixteenth aspect, wherein the deposition method deposits layers of the deposited silicon-based material and the layers of diamond-like carbon through openings in a mask.

An eighteenth aspect according to any of the fifteenth through seventeenth aspects, further comprising depositing the embossments by a method of pattern coating the embossments to cover an area that is equal to from 1 to 10 percent of a total area of the upper surface.

A nineteenth aspect according to any of the fifteenth through eighteenth aspects, further comprising depositing the embossments by a photolithographic method.

A twentieth aspect according to any of the fifteenth through nineteenth aspects, further comprising depositing multiple embossments on the surface, each embossment consisting of a total of from 4 to 100 total silicon carbide layers and diamond-like carbon layers, wherein the embossments cover an area that is equal to from 1 to 10 percent of a total area of the upper surface.

The invention claimed is:

1. An electrostatic chuck assembly comprising a wafer support surface that comprises a ceramic layer with at least one embossment at an upper surface of the ceramic layer, the at least one embossment comprising multiple layers that include at least two layers of deposited silicon-based material, and at least two diamond-like carbon layers.

2. The assembly of claim 1, wherein the at least one embossment comprises at least 6 total layers that include at least 3 layers of deposited silicon-based material and at least 3 diamond-like carbon layers, each deposited silicon-based material layer and each diamond-like carbon layer having a thickness in a range from 0.5 to about 3 microns.

3. The assembly of claim 1, wherein a top layer of the at least one embossment is a diamond-like carbon layer.

4. The assembly of claim 1, wherein the deposited silicon-based material is selected from silicon nitride (SiN), silicon carbide (SiC), silicon oxide (e.g., silicon dioxide, $SiO_2$), and silicon oxynitride (SiON).

5. The assembly of claim 1, wherein the at least one embossment consists of alternating layers of the deposited silicon-based material and diamond-like carbon.

6. The assembly of claim 1, wherein the deposited silicon-based material is silicon carbide.

7. The assembly of claim 1, wherein the at least one embossment includes multiple layers of silicon carbide and diamond-like carbon, each silicon carbide layer and each diamond-like carbon layer having a thickness in a range from 1 to 5 microns.

8. The assembly of claim 1, further comprising multiple embossments that each comprise multiple layers that include at least two silicon carbide layers and at least two diamond-like carbon layers.

9. The assembly of claim 1, wherein the at least one embossment includes from 4 to 100 total silicon carbide layers and diamond-like carbon layers.

10. The assembly of claim 1, wherein the at least one embossment has a diameter in a range from 0.75 to 1.5 millimeters.

11. The assembly of claim 1, wherein the at least one embossment has a height in a range from 5 to 100 microns.

12. The assembly of claim 1, wherein the diamond-like carbon contains atomic dopant to increase electrical conductivity of the at least one embossment.

13. The assembly of claim 1, further comprising multiple embossments, wherein the embossments cover an area that is equal to from 1 to 10 percent of a total area of the upper surface.

14. The assembly of claim 1, further comprising multiple embossments, each embossment consisting of from 4 to 100 total silicon carbide layers and diamond-like carbon layers, wherein the embossments cover an area that is equal to from 1 to 10 percent of a total area of the upper surface.

15. A method of preparing an electrostatic chuck assembly that comprises a ceramic layer with at least one embossment at an upper surface of the ceramic layer, the at least one embossment comprising multiple layers that include at least two layers of deposited silicon-based material and at least two diamond-like carbon layers, the method comprising depositing the at least one embossment onto the upper surface by a deposition method.

16. The method of claim 15, wherein the deposition method is plasma-enhanced chemical vapor deposition.

17. The method of claim 15, wherein the deposition method deposits the at least two layers of the deposited silicon-based material and the at least two layers of diamond-like carbon through openings in a mask.

18. The method of claim 15, further comprising depositing multiple embossments by a method of pattern coating, wherein the embossments cover an area that is equal to from 1 to 10 percent of a total area of the upper surface.

19. The method of claim 15, further comprising depositing multiple embossments by a photolithographic method.

20. The method of claim 15, further comprising depositing multiple embossments on the upper surface, each embossment consisting of from 4 to 100 total silicon carbide layers and diamond-like carbon layers, wherein the embossments cover an area that is equal to from 1 to 10 percent of a total area of the upper surface.

\* \* \* \* \*